United States Patent [19]
Liu et al.

[11] Patent Number: 6,156,478
[45] Date of Patent: Dec. 5, 2000

[54] PHOTOCURABLE AND PHOTOPATTERNABLE HYDROGEL MATRIX BASED ON AZLACTONE COPOLYMERS

[75] Inventors: Jie Liu, Woodbury; James G. Bentsen, North Saint Paul, both of Minn.

[73] Assignee: 3M Innovative Properties Company, Saint Paul, Minn.

[21] Appl. No.: 09/183,197

[22] Filed: Oct. 30, 1998

[51] Int. Cl.$^7$ .................................................. G03F 7/004
[52] U.S. Cl. .................... 430/270.1; 430/197; 430/325; 430/18; 428/304.4
[58] Field of Search .................. 430/270.1, 325, 430/18, 197; 524/916; 436/531; 435/40.5, 180, 181; 428/304.4

[56] References Cited

U.S. PATENT DOCUMENTS

| | | | |
|---|---|---|---|
| 3,583,950 | 6/1971 | Kollinsky et al. | 260/78 |
| 4,451,619 | 5/1984 | Heilmann et al. | 525/379 |
| 4,737,560 | 4/1988 | Heilmann et al. | 526/304 |
| 4,871,824 | 10/1989 | Heilmann et al. | 526/304 |
| 4,981,933 | 1/1991 | Fazio et al. | 526/260 |
| 5,200,471 | 4/1993 | Coleman et al. | 525/326.9 |
| 5,235,015 | 8/1993 | Ali et al. | 528/304 |
| 5,292,840 | 3/1994 | Heilmann et al. | 526/304 |
| 5,336,742 | 8/1994 | Heilmann et al. | 526/260 |
| 5,344,701 | 9/1994 | Gagnon et al. | 428/304.4 |
| 5,352,714 | 10/1994 | Lai et al. | 523/107 |
| 5,403,902 | 4/1995 | Heilmann et al. | 526/260 |
| 5,451,453 | 9/1995 | Gagnon et al. | 428/305.5 |
| 5,552,270 | 9/1996 | Khrapko et al. | 435/6 |
| 5,605,662 | 2/1997 | Heller et al. | 422/68.1 |
| 5,632,957 | 5/1997 | Heller et al. | 422/68.1 |
| 5,725,989 | 3/1998 | Chang et al. | 430/201 |
| 5,744,305 | 4/1998 | Fodor et al. | 435/6 |

FOREIGN PATENT DOCUMENTS

| | | |
|---|---|---|
| 196 26 003 A1 | 1/1997 | Germany. |
| 4-050946 | 2/1992 | Japan. |

OTHER PUBLICATIONS

Polymer Science Dictionary, Alger, M.S., Elsevier Science Publishing, NY, 1990, p. 86.

*Primary Examiner*—Janet Baxter
*Assistant Examiner*—Rosemary Ashton
*Attorney, Agent, or Firm*—Philip Y. Dahl

[57] ABSTRACT

Photocurable and photopatternable compositions are disclosed which comprise a) at least one copolymer derived from 1 to 99 parts by weight of at least one azlactone-functional monomer and 0 to 99 parts of at least one co-monomer; and b) at least one photocrosslinker. Articles are disclosed comprising a substrate and a gel layer of the cured composition which may be photopatterned with high resolution and used to bind biomolecules to the substrate.

30 Claims, 3 Drawing Sheets

PHOTOCURABLE AND PHOTOPATTERNABLE HYDROGEL MATRIX BASED ON AZLACTONE COPOLYMERS

FIELD OF THE INVENTION

This invention relates to a photocurable and photopatternable composition comprising a photocrosslinker and a polymer having azlactone functionality. The composition may be patterned with high resolution on a substrate and used to bind biologically active molecules.

BACKGROUND OF THE INVENTION

Various methods for immobilizing biomolecules to substrates have been disclosed.

U.S. Pat. No. 5,552,270 concerns a method of DNA sequencing wherein DNA oligonucleotides are immobilized in a matrix of gel squares which are supported on a substrate. The DNA is bound to the substrate by oxidation of an added 3' terminal 3-methyl uridine followed by reaction with a substrate-bound hydrazine to produce "a relatively stable morpholine derivative". ('270 at col. 5, lns. 41–47). The reference discloses gel squares that are between 25 and 100 $\mu$m on a side and are separated by spaces twice as wide. ('270 at col. 2, lns. 60–64).

U.S. Pat. No. 5,744,305 concerns a biological chip plate that includes DNA or peptide oligomer patches synthesized in situ by "light-directed synthesis", where protective groups are selectively removed prior to each monomer addition step by a light reaction using a mask. The initial base of each oligomeric strand is apparently bound to the substrate by attachment to an amine function. ('305 at FIGS. 1 & 2).

U.S. Pat. No. 4,871,824 concerns low-swelling beads of azlactone-functional polymers for use as reactive supports for immobilization of biologically active molecules.

U.S. Pat. No. 5,344,701 concerns methods for immobilizing biomolecules on substrates by attachment to azlactone-functional coatings. This reference discloses the application to a substrate of azlactone-functional monomers having free-radical addition sites, optionally with a free-radical crosslinker such as a divinyl, and subsequent polymerization in situ.

U.S. Pat. No. 5,725,989 concerns a laser addressable thermal transfer imaging element that comprises a support, a light-to-heat conversion layer, an interlayer, and a thermal transfer layer.

SUMMARY OF THE INVENTION

Briefly, the present invention provides a photocurable and photopatternable composition comprising a) at least one copolymer derived from 1 to 99 parts by weight of at least one azlactone-functional monomer and 0 to 99 parts of at least one co-monomer; and b) at least one photocrosslinker; wherein the composition may be used to bind biologically active molecules.

In another aspect, the present invention provides a hydrogel comprising the cured composition of the invention, where the gel is capable of binding biologically active molecules. The gel advantageously is swellable, thus providing a greater concentration of biologically active molecules per unit area when used as a coating.

In another aspect, the present invention provides a substrate coated with the composition of the invention, where the composition is capable of being patterned to a high resolution, which may be cured, and where the composition is capable of being reacted with biomolecules to immobilize the biomolecules on the substrate.

In another aspect, the present invention provides methods of making the coated substrates described above.

What has not been described in the art, and is provided by the present invention, is a composition and method useful for immobilizing biomolecules that employs azlactone-functional polymers in combination with photocrosslinkers. Furthermore, the composition of the present invention may be photopatterned with high resolution. Finally, the resulting cured gel preferably is swellable, providing a greater concentration of biomolecules per unit area.

In this application:

"azlactone," "azlactone function", and "azlactone moiety" mean substituted or unsubstituted 2-oxazolin-5-one groups of Formula I and/or 2-oxazin-6-one groups of Formula II:

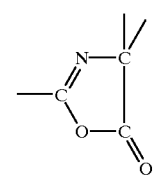

I

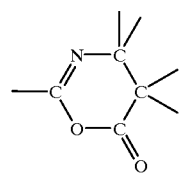

II

"azlactone-functional monomer" means a monomer whose structure includes an azlactone moiety, which optionally has been bound to a biomolecule by a ring opening reaction of the azlactone to form a biomolecule-azlactone bond;

"hydrogel" is a polymeric material capable of swelling in water by either physical interaction such as adsorption or absorption or chemical interaction such as hydrolysis, and refers to the gel material either before or after swelling in water;

"photocrosslinker" means a chemical species that is capable of binding two or more polymer molecules in response to the application of electromagnetic radiation and capable of attaching to the polymer molecules at a site other than the end of a growing polymer chain;

"copolymeric crosslinker" means a chemical species that is capable of binding two or more polymer molecules and that attaches to a polymer at the end of a growing polymer chain;

"biologically active" includes biochemically, immunochemically, physiologically or pharmaceutically active;

"biologically active molecule" and "biomolecule" are used interchangeably and include antibodies, antigens, enzymes, cofactors, inhibitors, hormones, receptors, coagulation factors, amino acids, histones, vitamins, drugs, cell surface markers, proteins and polypeptides, DNA including DNA oligonucleotides, RNA including RNA oligonucleotides, PNA, and derivatives of the foregoing; and "substituted" means substituted by conventional substituents which do not interfere with the desired product, e.g., substituents can be alkyl, alkoxy, aryl, phenyl, halo (F, Cl, Br, I), cyano, nitro, etc.

It is an advantage of the present invention to provide a composition and method useful for immobilizing biomolecules to a substrate that is applicable to a wide variety of biomolecules and may be photo-patterned with high resolution.

DETAILED DESCRIPTION OF PREFERRED EMBODIMENTS

Figure 1:
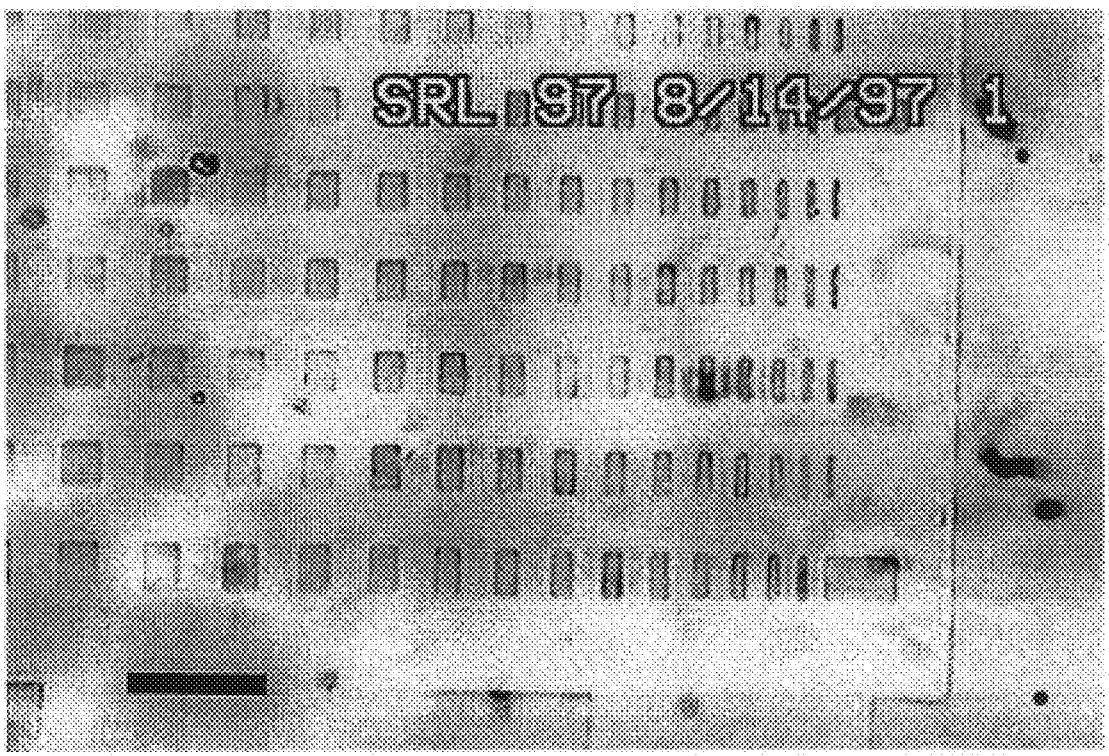
FIG. 1 is a micrograph of hydrogel pads according to the present invention taken at 200×magnification. The scale bar represents 100 µm.

The present invention provides a photocurable and photopatternable composition comprising a) at least one copolymer derived from 1 to 99 parts by weight of at least one azlactone-functional monomer and 0 to 99 parts of at least one co-monomer; and b) at least one photocrosslinker; wherein the composition may be used to bind biologically active molecules.

The copolymer of the azlactone-functional monomer may be any suitable polymer type, including polyolefin, polyamide, or polyimide. Preferably the polymer is a polyolefin. The copolymer may optionally contain crosslinks derived from copolymeric crosslinkers such as divinyl species.

The copolymer of the azlactone-functional monomer may be prepared by any suitable method, including methods disclosed in U.S. Pat. No. 4,451,619, U.S. Pat. No. 4,737,560, U.S. Pat. No. 5,200,471, U.S. Pat. No. 5,292,840, U.S. Pat. No. 5,336,742, U.S. Pat. No. 5,344,701, U.S. Pat. No. 5,403,902, U.S. Pat. No. 5,451,453 and U.S. Pat. No. 4,871,824, the disclosures of which are incorporated herein by reference. Preferred methods include free radical polymerization. Preferably the polymerization of the copolymer is complete before reaction with the photocrosslinker.

The azlactone-functional monomer may be any suitable monomer containing an azlactone function, including monomers having structures III and IV:

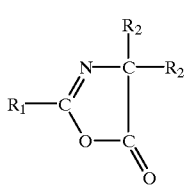

III

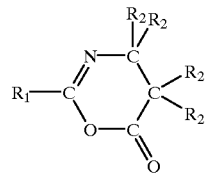

IV wherein $R_1$ is a polymerizable function such as vinyl, propylenyl and hexenyl
wherein each $R^2$ independently can be an alkyl group having 1 to 14 carbon atoms, a cycloalkyl group having 3 to 14 carbon atoms, an aryl group having 5 to 12 ring atoms, an arenyl group having 6 to 26 carbon and 0 to 3 S, N, and nonperoxidic O heteroatoms, or two $R^2$ substituents taken together with the carbon to which they are joined can form a carbocyclic ring containing 4 to 12 ring atoms. A preferred azlactone-functional monomer is 2-vinyl-4,4-dimethyl-2-oxazolin-5-one (vinyl dimethylazlactone, VDM).

The co-monomer may be any suitable monomer. Preferred monomers include vinyl group-containing and acryloyl group-containing compounds. A representative list of such monomers includes acrylamide, methacrylamide, N,N-dimethylacrylamide, diacetoneacrylamide, N-vinylpyrrolidone, hydroxyethyl methacrylate, 2-acrylamido-2-methylpropanesulfonic acid and its salts, N-(3-methacrylamidopropyl)-N,N,N-trimethylammonium salts, N,N-dimethylaminoethyl methacrylate, acrylic acid, methacrylic acid, itaconic acid, and combinations thereof. Preferred co-monomers are N,N-dimethylacrylamide and N-vinylpyrrolidone.

Optional copolymeric crosslinkers may be any suitable species with two or more polymerizable functions. Suitable multifunctional crosslinking monomers include ethylenically unsaturated (α,β-unsaturated) esters such as ethylene diacrylate, ethylene dimethacrylate, trimethylolpropane triacrylate and trimethacrylate, and α,β-unsaturated amides, such as methylenebis(acrylamide), methylenebis (methacrylamide), N,N'-diacryloyl-1,2-diaminoethane, N,N'-dimethacryloyl-1,2-diaminoethane, and reaction products of 2-alkenyl azlactones and short chain diamines.

The photocrosslinker may be any suitable chemical species that is capable of binding two or more polymer molecules in response to the application of electromagnetic radiation and that is capable of attaching to the polymer at sites other than the end of a growing polymer chain. The photocrosslinker should be capable of attaching to the polymer after polymerization of the polymer is complete. Preferred photocrosslinkers include bisazides, bisdiazocarbonyls, and bisdiazirines. The bisazides are most preferred with regard to ease of use. Azide (—$N_3$) groups release nitrogen ($N_2$) upon application of UV light, leaving behind a highly reactive divalent nitrogen, nitrene. Reactive carbene can be generated by photolysis of a diazocarbonyl or a diazirine. Active nitrene or carbene species can insert into many types of bonds including C—C or C—H bonds on pre-polymerized polymers to provide a crosslink. Azide, bisazide, azocarbonyl and bisdiazocarbonyl crosslinkers may form substrate-polymer links as well as polymer-polymer crosslinks, and are therefore preferred. Preferred diazide species include 2,6-bis(4-azidobenzylidene)-4-methyl cyclohexanone (BAMC), 4,4'diazidodiphenylether, 4,4'diazidodiphenylsulfone, 4,4'diazidodiphenylacetone, 4,4'diazidodiphenylmethane. Preferred bisdiazocarbonyl species include 1,4-bis(α-diazobenzyl) benzene. The photocrosslinker may be capable of thermal cure as well as photocure.

In another embodiment, the photocrosslinker may be a hetero-difunctional compound having a first function which attaches to the polymer and a second function which forms crosslinks upon application of light. For example, 4-[p-azidosalicyamido]butylamine (ASBA, available from Pierce Chemical Co., Rockford, Ill.) has an amine function that binds to an azlactone and an azido function that forms a crosslink to another polymer chain upon application of UV light, as described above.

"In cases where the photocrosslinker attaches to the polymer by occupying an azlactone function of the polymer, the crosslinker must be present in an amount less than 1 equivalent so that it does not occupy all of the azlactone sites necessary" to bind biomolecules. In other words, the number of azlactone-reactive functions present on photocrosslinkers must be less than the total number of azlactone functions present on the polymer. However, if the biomolecules are attached prior to photocrosslinking, i.e. the composition already contains biomolecule-azlactone bonds, then this condition need not apply.

The composition of the present invention may be coated on a substrate, cured (i.e. photocrosslinked), patterned, and reacted with biomolecules. By varying methods, these four steps may be done in any order. Many techniques, such as photolithographic patterning and laser induced thermal imaging (LITI) patterning, described below, involve simultaneous or near-simultaneous steps selected from coating, curing, or patterning of the composition.

The substrate may be any suitable material to which the polymer will adhere. Useful substrates include inorganic solids such as glass, ceramics, unfired metal and nonmetal oxides, clays, zeolites, and organic polymers. Preferred substrates are those that readily react with the photocrosslinker. When the photocrosslinker contains azide functions, such preferred substrates include organic polymers and surface-treated glass including siloxane-modified glass.

Coating of the composition on the substrate may be achieved by any suitable method. The coating may have a thickness in the range of 1 nanometer to 5 mm, but is preferably between 0.05 to 100 $\mu$m and most preferably between 1 to 20 $\mu$m.

The composition may be coated with or without addition of solvent. Suitable methods include spin coating, spray coating, knife coating, dipping, or roller coating. The composition may be selectively coated to provide a patterned surface. Such methods include known printing methods such as ink jet printing, offset, flexographic printing, etc. The composition may also be knife coated onto a microstructured surface (e.g. a surface having micron scale depressions or channels) in such a way that the composition resides in the microstructures, providing a patterned array of the composition.

The composition of the present invention may be cured by exposure to electromagnetic radiation, preferably UV light, most preferably UV-A light. The composition may be selectively cured by selective exposure to light. Selective exposure methods include exposure through a mask or photographic negative or exposure by a directed beam of light or laser. Uncured composition may then be removed, e.g. by washing, to provide a patterned coating. The composition may then be further cured, either by light or heat cure. Heat cure may entirely replace light cure in some circumstances, in particular where the gel is not patterned or is patterned by means other than photopatterning, such as mechanical means.

Patterning may be achieved by a variety of means including selective coating of the composition on a substrate, selective curing of the composition, or selective removal of the composition from a substrate. It is an advantage of the present invention that the composition may be photopatterned to a resolution of less than 2 $\mu$m by selective curing of the composition. Typical features are less than 100 $\mu$m in size. Preferably, the patterned coating has features of less than 200 $\mu$m in size, more preferably less than 20 $\mu$m, and most preferably less than 2 $\mu$m. The size dimensions referred to above are in-plane dimensions of the coated features or of the interstices between the coated features.

The composition may be patterned onto a substrate by laser addressable thermal transfer imaging processes such as those described in U.S. Pat. No. 5,725,989. In this process, a thermal transfer donor element is constructed comprising a support layer, a light-to-heat conversion layer, and a transfer layer comprising the composition to be patterned. When the donor element is brought in contact with a receptor and imagewise irradiated, a melt stick transfer process occurs and the composition containing transfer layer is imaged onto the receptor. The photocrosslinkable azlactone composition of this invention can be used in the transfer layer of such a system. This photocrosslinkable azlactone composition can be reacted with biomolecules before incorporation into the transfer layer, after incorporation into the transfer layer, or after laser addressed thermal transfer to the receptor. The azlactone composition of this invention can be thermally or photochemically crosslinked before or after the transfer process. This process offers the opportunity to pre-pattern different biomolecules onto a transfer layer comprising the present azlactone composition prior to laser addressed thermal imaging of individual azlactone-biomolecule conjugates to the receptor substrate. Registration of the donor and receptor elements may be robotically altered between any or all of the transfer steps to build up desired array spacings and sizes for transferred elements on the receptor that is different from the patterning of the biomolecules on the transfer layer. The laser addressable thermal imaging process offers high resolution imaging and high registration accuracy. A distinct advantage of the composition of the present invention is its capacity to bind biomolecules before or after thermal imaging and to provide a means to thermally or photochemcially cure the sample to the receptor after transfer.

The azlactone functions of the polymer may bind to a variety of attaching functions present on biomolecules, including, primary amine, secondary amine, hydroxy and thiol. These groups react, either in the presence or absence of suitable catalysts, with azlactones by nucleophilic addition to produce a residue of a biomolecule bound to a residue of an azlactone function.

A typical reaction pathway is:

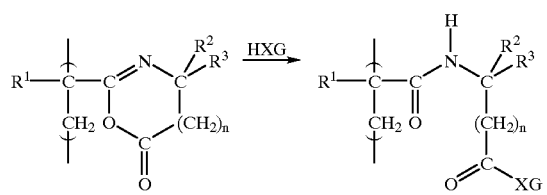

wherein $R^1$ is H or $CH_3$, $R^2$ and $R^3$ independently can be an alkyl group having 1 to 14 carbon atoms, a cycloalkyl group having 3 to 14 carbon atoms, an aryl group having 5 to 12 ring atoms, an arenyl group having 6 to 26 carbon and 0 to 3 S, N, and nonperoxidic O heteroatoms, or $R^2$ and $R^3$ taken together with the carbon to which they are joined can form a carbocyclic ring containing 4 to 12 ring atoms,
n is an integer 0 or 1,
X can be —O—, —S—, —NH—, or —NR$^4$— wherein R$^4$ can be $C_1$–$C_{20}$ alkyl, $C_6$–$C_{30}$ aryl, or a second bond to G,
HXG is a biomolecule having attaching function HX—, and
XG is a residue of HXG which remains bound to the polymer.

Depending on the attaching function of the biomolecule, catalysts may be required to achieve effective attaching reaction rates. Primary amine functions require no catalysts. Acid catalysts such as trifluoroacetic acid, ethanesulfonic acid, toluenesulfonic acid, and the like are effective with hydroxy and secondary amine functions. Amine bases such as triethylamine, 1,8-diazabicyclo[5.4.0]undec-7-ene (DBU) and 1,5-diazabicyclo[4.3.0]non-5-ene (DBN) (both available from Aldrich Chemical Co., Milwaukee, Wis.) are effective as well for hydroxy and thiol attaching functions. The level of catalyst employed is generally from 1 to 10 parts, preferably 1 to 5 parts, based on 100 parts of azlactone. The azlactone functions of the present invention advantageously prefer attachment to polypeptide and polynucleotide sequences at a terminal end.

The step of attaching biomolecules to the polymer may be carried out before or after coating, before or after curing, and before or after patterning.

After biomolecules are attached, capping groups may be added to occupy any unused azlactone functions and prevent later contamination of the gel by any unwanted material. Capping groups preferably react readily with the azlactone and preferably do not interfere with the desired characteristics of the gel. Preferably, the capping group is water soluble and thus improves the swellability of the gel. Preferable capping groups are primary amines and water.

The resulting cured gel is advantageously swellable, since a swellable gel may bind a greater amount of the biomolecule in a given area of a substrate. This increase in areal density improves the ability to take measurements such as optical readings of the target site and allows for greater miniaturization. The gel advantageously swells to at leas twice its dry volume when soaked in water overnight, preferably at least three times its dry volume, more preferably at least four times and most preferably at least five times its dry volume. The degree of swelling can be advantageously controlled through the amount of photocrosslinking agent employed.

This invention is useful in analytical devices employing biomolecules as test probes or reference standards, in particular where it is desirable to employ a variety of differing biomolecules in a compact area of a substrate.

For example, miniaturization of DNA sequencing operations onto microchips offers advances in speed and cost. Oligonucleotide containing gel pads of the present invention can be used to make high density DNA chips having anywhere from thousands to millions of probes spotted on the surface of a chip. In the method of sequencing by hybridization, a complete array of oligonucleotide probes (e.g. all 1024 possible pentamers, or all 65,536 possible octamers) is patterned onto a substrate and the DNA sample to be sequenced is allowed to specifically hybridize to the array. The target DNA sequence can be identified by analysis of the overlapping sets of oligomers that form perfect duplexes with the target sequence. As an example, chips such as these are useful in applications that require sequencing of multiple gene mutations, as might be required in detecting a polygenic disease.

Low density DNA chips generally can have up to 300 probes and are particularly suited to diagnostic applications where detection of a specific organism or strain or a panel of tests is required. In the case of low density arrays, gels of the present invention containing oligonucleotides can, for example, be patterned onto individually addressable microelectrodes that serve as an addressable programmable electronic matrix for free field electrophoretic control of target DNA hybridization as described in U.S. Pat. Nos. 5,632,957 and 5,605,662. A sample of DNA is electrophoretically moved from one microlocation to the next. Electronic stringency control is used to retain the DNA that matches the capture probe at each microlocation.

Microarrays of enzyme-containing gel pads of the present invention can be used to screen comical compounds for enzyme inhibiting or activating effect. Individual gel pads would be exposed to various doses of the target compound and the dose response monitored by determining the enzyme activity in each gel pad.

Natural or genetically engineered microorganisms can also be immobilized on individual gel pads of the present invention. Biomolecules on the surface of microorganisms serve as anchor points for attachment to the gel. The biological response of the microorganisms to chemical stimuli or other environmental conditions can be monitored. Alternatively, such microorganism-containing gel pads can be used as individual bioreactors.

Gels containing biological molecules that promote cell attachment and growth (e.g. growth factors or collagen) can be patterned using the methods and compositions describe above. The resultant patterned gels can be used to generate two dimensional cellular structures such as neuron networks, skin, or blood vessels.

Compositions of the present invention can also be used to support immunoassay panels, panels for drugs of abuse, enzyme based electrodes and optodes. Also, an array of gel pads can be used to soak up a metered amount of fluid containing microorganisms to be detected. Growth nutrients and fluorescent probes can be incorporated in the gel pads. The number of viable organisms in the sample can be related to the number of gel pads that exhibit a fluorescent response.

Objects and advantages of this invention are further illustrated by the following examples, but the particular materials and amounts thereof recited in these examples, as well as other conditions and details, should not be construed to unduly limit this invention.

EXAMPLES

Unless otherwise noted, all chemicals and reagents were obtained or are available from Aldrich Chemical Co., Milwaukee, Wis.

Example 1

Preparation of 1:1 Dimethylacrylamide:Vinyl Dimethylazlactone (DMA:VDM) Copolymer A solution of 70 parts dimethylacrylamide (DMA) and 70 parts 2-vinyl-4,4-dimethyl-2-oxazoline-5-one (vinyldimethylazlactone, VDM, commercially available from SNPE, Princeton, N.J.) in 210 parts methyl ethyl ketone (MEK) was mixed with 0.7 parts N,N'-azobis (isobutyronitrile) initiator (AIBN, commercially available as VAZO 64™, Wako Chemicals USA, Inc., Richmond, Va.). The mixture was sparged with nitrogen for 5 minutes, then sealed in a jar and tumbled in a lauderometer water bath at 60° C. for 24 hours. The resulting reaction mixture was shown gravimetrically to have 40.6% solids by evaporation of a sample at 120° C. for 3 hours.

Example 2

Lithographic Patterning of (DMA:VDM) Using 2, 6-bis(4-Azidobenzyidene)-4-Methyl Cyclohexanone (BAMC) Photocrosslinker: Dimethylformamide (DMF) Solvent

A 50:50 (w/w) DMA:VDM copolymer (prepared as described in Example 1) was prepared as a 40% (w/w) solution in methyl ethyl ketone (MEK) solvent. The MEK was extracted in a vacuum desiccator for 24 hours. The dried copolymer was re-dissolved in dimethylformamide to make a 40% (w/w) solution. Under low-lighting conditions (<0.1 foot candles (fc), measured at 555 nm, using a Spectroline DIX-555A sensor, Spectronics Corp., Westbury, Conn.), 28 mg of wet 2,6-bis(4-azidobenzylidene)-4-methyl cyclohexanone (BAMC)(containing 30% water) was dried in a vacuum dessicator at 23° C. and approximately 0.1 mtorr, then added to 2 g of the DMA:VDM solution. The resulting mixture was hand spread using a spatula onto a 1.5 cm×2.0 cm×1 mm thick sheet of poly(methylmethacrylate) (PMMA, DRG-100, Atohaas Americas, Inc., Philadelphia, Pa.). A fused silica photolithographic mask (MRS-3, Geller Microanalytical Laboratory, Topsfield, Mass.) was dip coated with an aqueous 1% sodium dodecyl sulphate solution as a releasing agent, then dried under a nitrogen stream. The mask was applied by hand to the coated PMMA sheet with the chromate patterns contacting the DMA:VDM coating, and the laminate was exposed to UV irradiation source (Model: ELC4001, Electro-lite Corp., Danbury, Conn. with 400W Hg lamp at 18 mW/cm$^2$, measured at 365 nm by a Spectroline DIX-365 sensor, Spectronics Corp., Westbury, Conn.) for 3 minutes. Under low-lighting conditions (as described above), the mask was removed and unexposed polymer was rinsed from the PMMA with 100% isopropyl alcohol. The resultant lithographically patterned DMA:VDM hydrogel was dried under nitrogen to provide a high resolution gel array. Microscopy at 200×(using a Leica Model DMRX microscope, Leica, Wetzler, Germany) showed that gel pads 20 $\mu$m×20 $\mu$m and gel pads as small as 5 $\mu$m×20 $\mu$m were readily produced. See FIG. 1.

Figure 2:
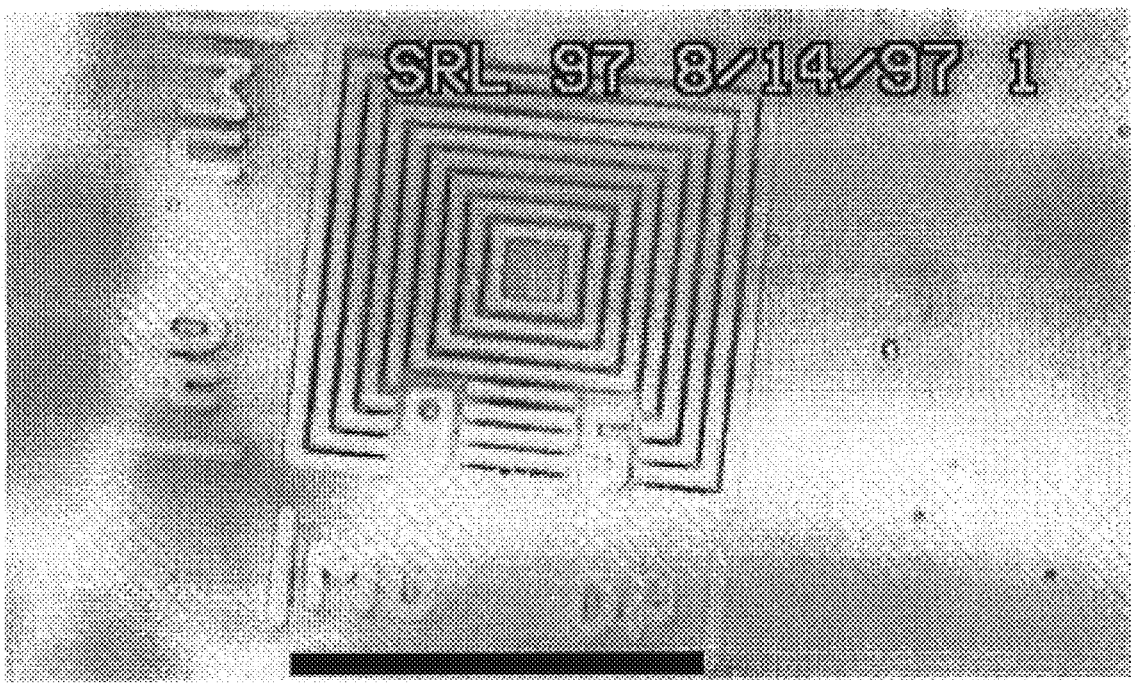
FIG. 2 is micrograph of hydrogel patterns according to the present invention taken at 1000×magnification. The scale bar represents 40 µm.

In a similar manner, hydrogel patterns on PMMA were obtained using the MRS-3 mask described above to provide patterns having resolution of less than 2 $\mu$m. A micrograph at 1000×magnification (made using a Leica Model DMRX microscope, Leica, Wetzler, Germany) showed that azlactone hydrogels can be lithographically patterned with better than 2 $\mu$m resolution. See FIG. 2.

Example 3

Lithographic Patterning of DMA:VDM Using BAMC Photocrosslinker: MEK/Butyl Acetate Solvent Mixture

A 40% (w/w) solution of 50:50 DMA:VDM copolymer (prepared as described in Example 1) in MEK was mixed with an equal amount of a 2.86% (w/w) solution of BAMC (30% aqueous suspension) in butyl acetate. The butyl acetate solution of the resulting mixture was spin coated at 4,500 rpm on a Photo-resist spinner (Model 1-EC101D-R435, Headway Research Inc., Garland, Tex.) onto a 1.5 cm×2.0 cm×1 mm PMMA sheet. The coating was allowed to dry in a vacuum desiccator for 1 hour at 23° C. and approximately 0.1 mtorr. Lithographic procedures as described in Example 2 provided gel patterns having resolution essentially the same as that shown in Example 2, as shown by microscopy.

These gels were allowed to hydrolyze and swell in water overnight. The gels swelled by about 500%, and did not undergo significant changes in shape over a period of 30 days. Significantly, the swelled gels remained bonded to the PMMA support.

To demonstrate the reactivity of the photo-crosslinked composition, a second sample was prepared and treated as follows: 54 nM of amine-terminated oligonucleotide octamer containing a fluorescein reporter probe (5'-FITC-T$_8$-3'—NH$_2$, Genemed Synthesis, S San Francisco, Calif.; FITC=fluorescein isothiocyanate) was dissolved in 20 $\mu$L of carbonate bicarbonate buffer (0.05 M, pH 9.2). The oligonucleotide solution was spotted onto the photocured DMA:VDM coating using an EFD 32 gauge flat-tip needle (EFD Corp., E. Providence, R.I.). The sample was put in a sealed, humidified container for 2 hours at room temperature before washing with DI water and incubating in DI water for 10 hours. Bright spots of fluorescence were observed using an epifluorescence microscope (Leica) to detect the FITC reporter, indicating covalent attachment of the oligonucleotide to the photo-crosslinked gel via reaction of the amine with azlactone functionality.

In the control sample, the cured DMA:VDM coating was incubated in DI water for one hour to hydrolyze the azlactone rings and then dried in a stream of nitrogen before spotting the amine terminated oligonucleotide solution and incubating in a humidified container for 2 hours. The sample was washed with DI water and examined under fluorescence microscopy. No fluorescent spots were observed under the same detector gain.

These results provide supporting evidence that (1) reactive azlactone functionality is preserved in the photo-crosslinking step, (2) covalent attachment of the amine terminated oligonucleotide proceeds rapidly through reaction with these intact azlactone rings, and (3) nonspecific binding of the oligonucleotide does not occur once the capping reaction (conversion of residual azlactone to carboxylate) is complete.

Example 4

Lithographic Patterning of DMA:VDM Using 4-(p-Azidosalicyamido)Butylamine (ASBA)

Under low-lighting conditions (as described above), 25 mg of 4-(p-azidosalicyamido)butylamine (ASBA, commercially available from Pierce Chemical Co., Rockford, Ill.) and 10 mg of 1-ethyl-3-(3-dimethylaminopropyl) carbodiimide promoter (EDC, HCl salt, Pierce Chemical Co., Rockford, Ill.)) were dissolved in 0.5 ml of 95:5 (v/v) isopropanol:water. This solution and one drop of aq. 1N HCl were added to 1 mL of a 40% (w/w) solution of 50:50 DMA:VDM copolymer (Example 1) in MEK. Thermal coupling of the butylamine portion of ASBA to azlactone functional groups was allowed to take place for 2 hour at room temperature. The MEK solution of the resulting mixture was spin-coated onto a PMMA substrate and dried in a vacuum desiccator for 15 minutes. The sample was lithographically exposed to UV irradiation at 18 mW/cm$^2$, measured at 365 nm (Spectroline DIX-365 sensor, Spectronics Corp., Westbury, Conn.), using the MRS-3 mask for 3 minutes to photocrosslink through the azido portion of bound ASBA. The mask was removed and the sample was washed thoroughly with pure isopropyl alcohol. Gel patterns with comparable resolution to Example 2 were observed by microscopy using a Leica Model DMRX microscope. This dual cure approach increases the efficiency for crosslinking compared to a bisazide crosslinker.

Example 5

Lithographic Patterning of DMA:VDM Using a UV-Curable Acrylate Adhesive

This example demonstrates that gels with azlactone functionality can be lithographically patterned using a mixture of azlactone polymer with UV-curable polymer. The advantage of this approach is that the density of azlactone can be varied by mixing UV-curable polymer and azlactone polymer in different ratios.

A 40% (w/w) solution of 50:50 DMA:VDM copolymer (Example 1) in MEK was mixed in varying amounts with UV curable acrylate adhesive (Class VI Medical Grade Adhesive, Model 4M01, Electro-lite Corp., Danbury, Conn.) at 1:1 to 1:30 v/v ratios. The mixtures were hand spread onto PMMA. Lithographic procedures as described in Example 2 were followed with a five minute UV exposure. Comparable resolution to Example 2 was observed on gel arrays at a ratio of 5 parts acrylate adhesive:2 parts azlactone copolymer, v/v.

Example 6

Laser Induced Thermal Imaging (LITI) of DMA:VDM Using BAMC photocrosslinker

Laser Induced Thermal Imaging (LITI) donor sheets consisted of the azlactone hydrogel layer, a polyacrylate interlayer, and a carbon black light-to-heat conversion layer on a polyethylene terephthalate substrate. These donor sheets were prepared as follows:

The light-to-heat conversion layer was prepared by coating an aqueous dispersion of carbon black in a radiation curable resin onto a 4 mil PET substrate with a Yasui Seiki Lab Coater, Model CAG-150 (Yasui Seiki Co., Bloomington, Ind.) using a microgravure roll of 90 helical cells per lineal inch. The coating composition was 1 part trimethylolpropane triacrylate (Sartomer™ SR351HP, Sartomer Co. Inc., Exton, Pa.), 1.15 parts 3M Matchprint Negative Black Millbase (3M Co., St. Paul, Minn.), and 5% 2-hydroxy-2,2-dimethylacetophenone photoinitiator (Darocur™ 1173, Ciba Specialty Chemicals Co., Tarrytown, N.Y.). The coating was subsequently in-line dried and UV-cured on the coater. The transmission optical density (TOD=-logT, where T is the measured fractional transmission) of the coated film was 2.35 at 1060 nm.

The polyacrylate interlayer was prepared as a 20% solids solution of 130 g trimethylolpropane triacrylate (Sartomer™ SR351HP), 130 g of a 3:1 mixture (25% solids w/w/) and polyvinyl butyral (Butvar™ B98, Monsanto Co., St. Louis, Mo.), 221 g 1-methyl-2-propanol, 8.13 g Darocur™ 1173 in 331.5 g methyl ethyl ketone, which was then coated onto the light-to-heat conversion layer at a thickness of from 1.0 to 1.2 $\mu$m and cured with actinic radiation via exposure in a Radiation Polymer Corporation (Plainfield, Ill.) UV Processor Model No. QC 1202AN3TR (medium pressure UV lamp, total exposure ca. 100 millijoules/cm$^2$, N$_2$ atmosphere) to produce an interlayer.

A 40% (w/w) solution of 60:40 (w/w) DMA/VDM copolymer (prepared as described in Example 1, using 56 parts DMA and 84 parts VDM) solid was prepared in cyclohexanone as described in Example 2. The residue resulting from drying 28 mg of a 30% aqueous suspension of BAMC crosslinker was taken up in 2 mL of the polymer-cyclohexanone solution, and the resulting mixture was hand spread onto the interlayer under reduced lighting conditions, at a target coating thickness of 5 $\mu$m to complete the LITI donor substrate.

Material was transferred by LITI to a glass receptor sheet. The LITI apparatus used a YAG laser (Model 2600 from Control Laser Corporation, Orlando, Fla.) operated in the continuous wave (cw) mode. The cw output beam was incident on a model 1201E-2 acousto-optic modulator (AOM) driven by a model 231 A rf driver, both from Isomet Corporation, Springfield, Va. The component of the YAG laser beam diffracted into the first order by the AOM was selected by an aperture and focused to a 100 $\mu$m diameter spot with a three element, 2.5" focal length objective lens. The LITI donor sheet in contact with the glass receptor was placed at the focus of the objective lens on a model number ATS50030 xy translation stage from Aerotech Inc., Pittsburg, Pa. The rf driver for the AOM was gated on and off with a model 8116A function generator from Hewlett-Packard, Santa Clara, Calif. In this way different areas of the LITI donor sheet/receptor combination were moved into the laser beam and the laser beam turned on and off to produce optical pulses with pulse widths in the range of 0.1–100 msec. Absorption of these laser pulses by the donor sheet resulted in rapid heating of the above described DMAIVDM copolymer layer and thermal transfer of the copolymer to the glass receptor.

Figure 3:
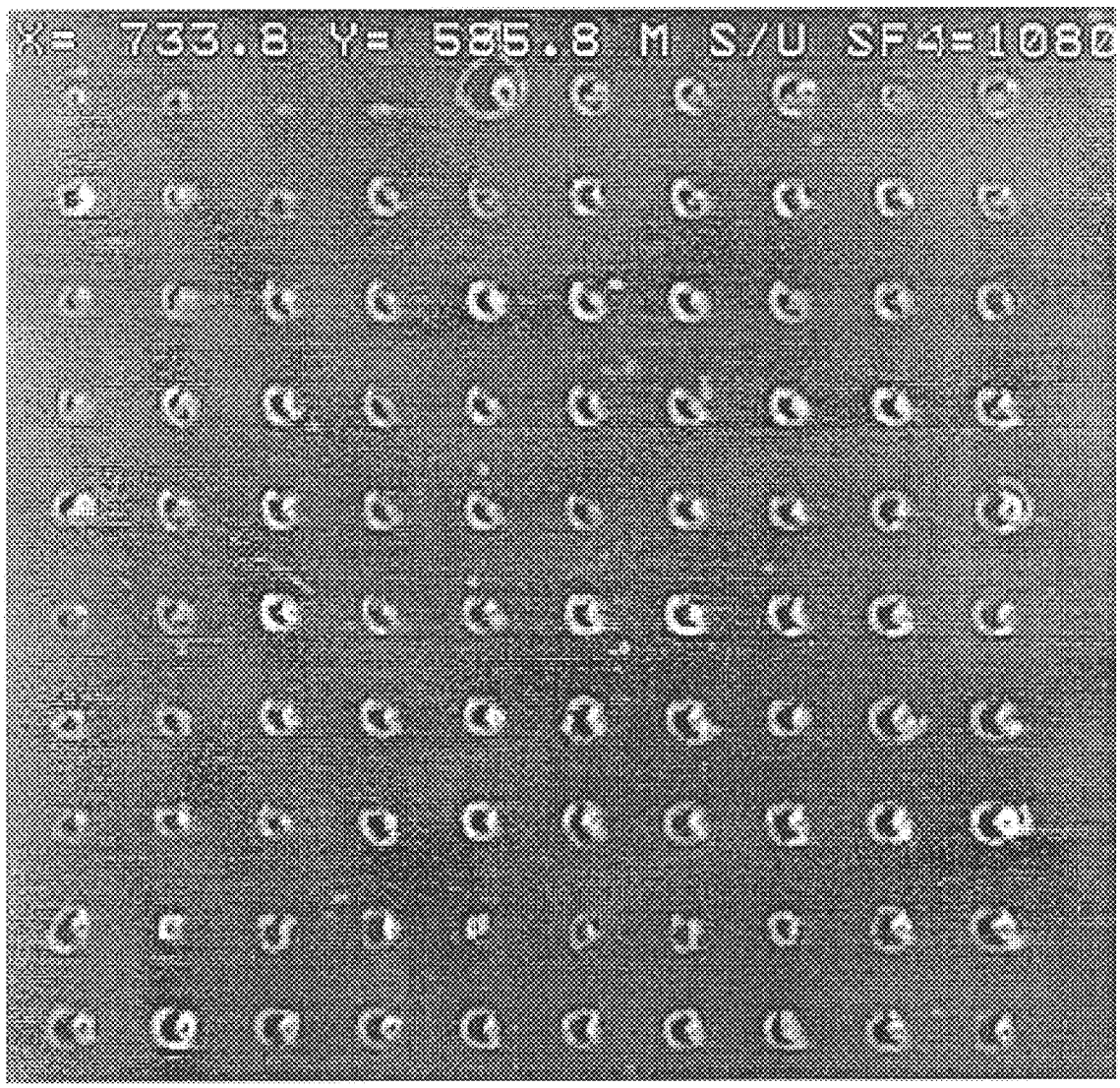
FIG. 3 is a micrograph of hydrogel pads according to the present invention taken at 100×magnification. The spacing between centers is 200 µm.

Thermal transfer experiments were conducted with the laser power at the LITI sample set to a value of 0.128 W, as measured with a model J3-09 detector from Molectron Detector, Inc. Portland, Oreg. In these experiments the optical pulse width was varied between 2 and 7 msec. It was found that for donor sheets where the copolymer did not contain the BAMC crosslinker there was some copolymer transfer in areas not exposed to the laser beam. This transfer was reduced, but not completely eliminated, by removing residual cyclohexanone from the donor sheet. The crosslinked copolymer material did not exhibit any tendency to block. It was possible to produce 50 $\mu$m diameter, 4 $\mu$m thick gel pads from the crosslinked donor sheets at pulse widths of 6 and 7 msec, as seen by microscopy at 100 X using a Leica Model DMRX microscope. See FIG. 3.

Example 7

Laser Induced Thermal Imaging (LITI) of an Enzyme Bound to DMA:VDM Using BAMC Photocrosslinker Laser Induced Thermal Imaging (LITI) donor sheets were prepared as described in Example 6 with the following change: The azlactone hydrogel coating was treated at various locations with a 1 mg/mL solution of $\beta$,-D-glucosidase enzyme in 50 mM sodium phosphate buffer pH 7.6 and allowed to dry. This provided covalent attachment of the enzyme to the azlactone transfer layer of the donor sheet construction via reaction of reactive pendant groups on the enzyme with the azlactone functionality of the hydrogel composition.

Enzyme impregnated azlactone was transferred by LITI to a PVdC (polyvinylidene chloride) primed PET receptor sheet using methods similar to those described in Example 6. In this case 100 $\mu$m wide stripes were imaged onto the receptor and subsequently crosslinked. Some stripes corresponded to regions of the donor sheet where enzyme had been applied. Some stripes corresponded to control regions where no enzyme was applied. All stripes were innoculated with a 0.05 mM solution of an indicator (4 methyl-umbelliferyl-$\beta$-D-glucoside) that becomes fluorescent as a result of enzymatic cleavage by $\beta$-D-glucosidase enzyme. Using a Leica epifluorescence microscope, a bright blue fluorescence was observed for the enzyme impregnated stripes, while the control stripes showed no fluorescence. These results show that after covalent attachment to the hydrogel composition, LITI transfer of the composition, and crosslinking of the composition, enzyme activity is retained.

Various modifications and alterations of this invention will become apparent to those skilled in the art without departing from the scope and principles of this invention, and it should be understood that this invention is not to be unduly limited to the illustrative embodiments set forth hereinabove. All publications and patents are herein incorporated by reference to the same extent as if each individual publication or patent was specifically and individually indicated to be incorporated by reference.

We claim:

1. An article of manufacture comprising a hydrogel bound to a substrate, said hydrogel comprising a photocurable and photopatternable composition which has been photocured, said composition comprising:
   a) at least one polymer derived from 1 to 99 parts by weight of at least one azlactone-functional monomer and 0 to 99 parts by weight of at least one co-monomer; and
   b) at least one photocrosslinker;
      wherein, if said composition contains no biomolecule-azlactone bonds, the number of azlactone-reactive functions present on the photocrosslinkers is less than the number of azlactone functions present in said composition,
      wherein said hydrogel is separated into discrete zones each bound to said substrate.

2. The article of manufacture of claim 1, wherein a feature selected from one of said discrete zones and an interstice between any of said discrete zones has a smallest dimension in the plane of the layer of said hydrogel of less than 200 µm.

3. The article of manufacture of claim 1, wherein a feature selected from one of said discrete zones and an interstice between any of said discrete zones has a smallest dimension in the plane of the layer of said hydrogel of less than 2 µm.

4. The article of manufacture of claim 1 wherein the volume of said gel after soaking in water is 300% or more of the volume of the dry gel.

5. The hydrogel of claim 4, additionally comprising a biologically active molecule covalently bound to a residue of an azlactone function of said hydrogel.

6. The article of manufacture of claim 1, additionally comprising a biologically active molecule covalently bound to a residue of an azlactone function in one or more of said discrete zones of said hydrogel.

7. The article of manufacture of claim 1, additionally comprising different biologically active molecules covalently bound to residues of azlactone functions in different discrete zones of said hydrogel.

8. The article of manufacture of claim 1 wherein at least one of said azlactone-functional monomers is 2-vinyl-4,4-dimethyl-2-oxazolin-5-one (vinyl dimethylazlactone, VDM) monomer.

9. A photocurable and photopatternable composition comprising:
   a) at least one polymer derived from 1 to 99 parts by weight of at least one azlactone-functional monomer and 0 to 99 parts by weight of at least one co-monomer; and
   b) at least one photocrosslinker;
      wherein, if said composition contains no biomolecule-azlactone bonds, the number of azlactone-reactive functions present on the photocrosslinkers is less than the number of azlactone functions present in said composition;
      additionally comprising a biologically active molecule covalently bound to a residue of an azlactone function.

10. A method of making an article of manufacture comprising the steps of:
   a) applying to a substrate a layer of a photocurable and photopatternable composition comprising:
      i) at least one polymer derived from 1 to 99 parts by weight of at least one azlactone-functional monomer and 0 to 99 parts by weight of at least one co-monomer; and
      ii) at least one photocrosslinker;
         wherein, if said composition contains no biomolecule-azlactone bonds, the number of azlactone-reactive functions present on the photocrosslinkers is less than the number of azlactone functions present in said composition; and
   b) irradiating said layer with electromagnetic radiation so as to cure at least a portion of said layer;
      wherein said step of irradiation comprises application of radiation through a mask so as to selectively expose portions of said layer to radiation.

11. The method of claim 10 additionally comprising the step of washing the article after irradiation so as to remove unexposed photocurable composition.

12. The method of claim 10 additionally comprising a step of securing a biologically active molecule to a portion of said article by reaction with an azlactone function of said composition prior to cure of said layer of photocurable composition.

13. The method of claim 10 additionally comprising a step of securing a biologically active molecule to a portion of said article by reaction with an azlactone function of said composition after cure of said layer of photocurable composition.

14. A method of making an article of manufacture comprising the steps of:
   a) applying to a substrate a layer of a photocurable and photopatternable composition comprising:
      i) at least one polymer derived from 1 to 99 parts by weight of at least one azlactone-functional monomer and 0 to 99 parts by weight of at least one co-monomer; and
      ii) at least one photocrosslinker;
         wherein, if said composition contains no biomolecule-azlactone bonds, the number of azlactone-reactive functions present on the photocrosslinkers is less than the number of azlactone functions present in said composition; and
   b) irradiating said layer with electromagnetic radiation so as to cure at least a portion of said layer;
      wherein said layer of photocurable composition is applied to said substrate in a pattern covering portions of said substrate and leaving other portions not covered.

15. The method of claim 14 additionally comprising a step of securing a biologically active molecule to a portion of said article by reaction with an azlactone function of said composition prior to cure of said layer of photocurable composition.

16. The method of claim 14 additionally comprising a step of securing a biologically active molecule to a portion of said article by reaction with an azlactone function of said composition after cure of said layer of photocurable composition.

17. A method of making an article of manufacture comprising the steps of:
   a) applying to a substrate a layer of a photocurable and photopatternable composition comprising:
      i) at least one polymer derived from 1 to 99 parts by weight of at least one azlactone-functional monomer and 0 to 99 parts by weight of at least one co-monomer; and ii) at least one photocrosslinker;
    wherein, if said composition contains no biomolecule-azlactone bonds, the number of azlactone-reactive functions present on the photocrosslinkers is less than the number of azlactone functions present in said composition; and
b) irradiating said layer with electromagnetic radiation so as to cure at least a portion of said layer;
    additionally comprising a step of removing portions of said layer of photocurable composition prior to cure so as to form a pattern.

18. The method of claim 17 additionally comprising a step of securing a biologically active molecule to a portion of said article by reaction with an azlactone function of said composition prior to cure of said layer of photocurable composition.

19. The method of claim 17 additionally comprising a step of securing a biologically active molecule to a portion of said article by reaction with an azlactone function of said composition after cure of said layer of photocurable composition.

20. A method of making an article of manufacture comprising the steps of:
a) applying to a substrate a layer of a photocurable and photopatternable composition comprising:
    i) at least one polymer derived from 1 to 99 parts by weight of at least one azlactone-functional monomer and 0 to 99 parts by weight of at least one co-monomer; and
    ii) at least one photocrosslinker;
        wherein, if said composition contains no biomolecule-azlactone bonds, the number of azlactone-reactive functions present on the photocrosslinkers is less than the number of azlactone functions present in said composition; and
b) irradiating said layer with electromagnetic radiation so as to cure at least a portion of said layer;
    additionally comprising a step of removing portions of said layer of photocurable composition after cure so as to form a pattern.

21. The method of claim 20 additionally comprising a step of securing a biologically active molecule to a portion of said article by reaction with an azlactone function of said composition prior to cure of said layer of photocurable composition.

22. The method of claim 20 additionally comprising a step of securing a biologically active molecule to a portion of said article by reaction with an azlactone function of said composition after cure of said layer of photocurable composition.

23. A method of making an article of manufacture comprising the steps of:
a) applying to a substrate a layer of a photocurable and photopatternable composition comprising:
    i) at least one polymer derived from 1 to 99 parts by weight of at least one azlactone-functional monomer and 0 to 99 parts by weight of at least one co-monomer; and
    ii) at least one photocrosslinker;
        wherein, if said composition contains no biomolecule-azlactone bonds, the number of aziactone-reactive functions present on the photocrosslinkers is less than the number of azlactone functions present in said composition; and
b) irradiating said layer with electromagnetic radiation so as to cure at least a portion of said layer;
    additionally comprising a step of securing a biologically active molecule to a portion of said article by reaction with an azlactone function of said composition prior to cure of said layer of photocurable composition.

24. A photocurable and photopatternable composition comprising:
a) at least one polymer derived from 1 to 99 parts by weight of at least one azlactone-functional monomer and 0 to 99 parts by weight of at least one co-monomer; and
b) at least one photocrosslinker;
    wherein, if said composition contains no biomolecule-azlactone bonds, the number of azlactone-reactive functions present on the photocrosslinkers is less than the number of azlactone functions present in said composition;
    wherein at least one of said photocrosslinkers is 2,6-bis(4-azidobenzylidene)-4-methyl cyclohexanone (BAMC).

25. A photocurable and photopatternable composition comprising:
a) at least one polymer derived from 1 to 99 parts by weight of at least one azlactone-functional monomer and 0 to 99 parts by weight of at least one co-monomer; and
b) at least one photocrosslinker;
    wherein, if said composition contains no biomolecule-azlactone bonds, the number of azlactone-reactive functions present on the photocrosslinkers is less than the number of azlactone functions present in said composition;
    wherein at least one of said photocrosslinkers is 4-[p-azidosalicyamido]butylamine (ASBA).

26. A hydrogel comprising a photocurable and photopatternable composition which has been photocured, said composition comprising:
a) at least one polymer derived from 1 to 99 parts by weight of at least one azlactone-functional monomer and 0 to 99 parts by weight of at least one co-monomer; and
b) at least one photocrosslinker;
    wherein, if said composition contains no biomolecule-azlactone bonds, the number of azlactone-reactive functions present on the photocrosslinkers is less than the number of azlactone functions present in said composition;
    additionally comprising a biologically active molecule covalently bound to a residue of an azlactone function of said hydrogel;
    wherein said biologically active molecule is a portion of a microorganism by which said microorganism is attached to said gel.

27. An article of manufacture comprising a hydrogel bound to a substrate, said hydrogel comprising a photocurable and photopatternable composition which has been photocured, said composition comprising:
a) at least one polymer derived from 1 to 99 parts by weight of at least one azlactone-functional monomer and 0 to 99 parts by weight of at least one co-monomer; and
b) at least one photocrosslinker;
    wherein, if said composition contains no biomolecule-azlactone bonds, the number of azlactone-reactive functions present on the photocrosslinkers is less than the number of azlactone functions present in said composition;

additionally comprising a biologically active molecule covalently bound to a residue of an azlactone function of said hydrogel;

wherein said biologically active molecule is a portion of a microorganism by which said microorganism is attached to said article of manufacture.

28. A photocurable and photopatternable composition comprising:
   a) at least one polymer derived from 1 to 99 parts by weight of at least one azlactone-functional monomer and 0 to 99 parts by weight of at least one co-monomer; and
   b) at least one photocrosslinker;
      wherein, if said composition contains no biomolecule-azlactone bonds, the number of azlactone-reactive functions present on the photocrosslinkers is less than the number of azlactone functions present in said composition;
      wherein at least one of said photocrosslinkers is selected from the group consisting of bisazides, bisdiazocarbonyls, and bisdiazirines.

29. The photocurable and photopatternable composition according to claims 28 wherein at least one of said photocrosslinkers is a bisazide.

30. A photocurable and photopatternable composition comprising:
   a) at least one polymer derived from 1 to 99 parts by weight of at least one azlactone-functional monomer and 0 to 99 parts by weight of at least one co-monomer; and
   b) at least one photocrosslinker;
      wherein, if said composition contains no biomolecule-azlactone bonds, the number of azlactone-reactive functions present on the photocrosslinkers is less than the number of azlactone functions present in said composition;
      wherein at least one of said photocrosslinkers is a hetero-difunctional compound having a first function which attaches to the polymer and a second function which forms crosslinks upon application of light.

* * * * *

UNITED STATES PATENT AND TRADEMARK OFFICE
CERTIFICATE OF CORRECTION

PATENT NO. : 6,156,478
DATED : December 5, 2000
INVENTOR(S) : Jie Liu and James G. Bentsen It is certified that error appears in the above-identified patent and that said Letters Patent is hereby corrected as shown below:

Title page,
Item [57] ABSTRACT, "photopattemable" should read -- photopatternable --

Column 6,
Line 5, "100 µm" should read -- 1000 µm --

Column 7,
Line 41, "leas" should read -- least --

Column 9,
Line 4, "6-bis(4-Azidobenzyidene)" should read -- 6-bis(4-Azidobenzylidene) --

Column 12,
Line 15, "DMAIVDM" should read -- DMA/VDM --

Column 15,
Line 63, "aziactone-reactive" should read -- azlactone-reactive --

Column 16,
Line 34, "butylamine" should read -- butylalmine --

Signed and Sealed this

Twenty-sixth Day of March, 2002

*Attest:*

JAMES E. ROGAN
*Attesting Officer*   *Director of the United States Patent and Trademark Office*